United States Patent
Maishev et al.

(10) Patent No.: US 6,250,250 B1
(45) Date of Patent: Jun. 26, 2001

(54) MULTIPLE-CELL SOURCE OF UNIFORM PLASMA

(76) Inventors: Yuri Maishev, Russian Federation 113204, Sumskoy Proezd 21, Bldg. 1, Apt. 43, Moscow (RU); James Ritter, 44856 Vista Del Sol, Fremont, CA (US) 94539; Leonid Velikov, 1371 Greenbrier Rd., San Carlos, CA (US) 94070; Alexander Shkolnik, 485 Dartmouth Ave., San Carlos, CA (US) 94070

( * ) Notice: Subject to any disclaimer, the term of this patent is extended or adjusted under 35 U.S.C. 154(b) by 0 days.

(21) Appl. No.: 09/272,646

(22) Filed: Mar. 18, 1999

(51) Int. Cl.[7] .................................................. C23C 16/00
(52) U.S. Cl. ..................................... 118/723 ER; 156/345
(58) Field of Search ................ 118/723 E, 723 ER, 118/723 MR, 723 MA; 156/345

(56) References Cited

U.S. PATENT DOCUMENTS

| | | | |
|---|---|---|---|
| 5,114,529 | * | 5/1992 | Masuyama et al. ............... 156/643 |
| 5,336,326 | * | 8/1994 | Karner et al. .................. 118/723 HC |
| 5,531,862 | * | 7/1996 | Otsubo et al. .................... 156/643.1 |
| 5,928,427 | * | 7/1999 | Hwang ........................... 118/723 E |

OTHER PUBLICATIONS

J. Reece Roth : Industrial Plasma Engineering, vol. 1, Principles, Institute of Physics Publishing, Bristol and Philadelphia, 1995, pp. 332, 438.

Donald Smith : Thin–Film Deposition, Principle and Practice, McGraw–Hills, Inc., NY–Toronto, 1995, p. 511.

* cited by examiner

Primary Examiner—Gregory Mills
Assistant Examiner—Luz L. Alejandro

(57) ABSTRACT

A multiple-cell plasma source consists of a pair of perforated plate-like cathodes and a perforated plate-like anode between the both cathode plates. Perforations in all three plates are coaxial and form a plurality of cells in which a Penning discharge plasma is generated due to the passage of axial components of the magnetic field through the individual cells. Since in all cells the plasma flow components are generated and work independently, there are no limitations for an increase in the surface area of the upper cathode plate, which has plasma emitting holes, so that the plasma source can treat objects of a large surface area. The plasma source of the invention has various means for controlling and adjusting the plasma pattern, distribution, parameters, and shape.

33 Claims, 10 Drawing Sheets

MULTIPLE-CELL SOURCE OF UNIFORM PLASMA

FIELD OF THE INVENTION

The present invention relates to plasma processing technology, and more particularly to a multiple-cell source of a uniform plasma intended for treating surfaces of objects, such as semiconductor substrates. Examples of such treatment are surface activation, etching, cleaning, deposition, etc.

BACKGROUND OF THE INVENTION

Plasma is highly ionized gas containing an approximately equal number of positive ions and electrons.

Plasma sources for industrial application have been developed during the last 30–35 years. At the present time plasma sources find wide application in various fields of technology, in particular in the manufacture of semiconductor devices, e.g., for cleaning, etching, deposition, etc., in the production of semiconductor chips.

There exist a great variety of plasma sources that differ in the methods of plasma excitation and the geometry of the electrodes and plasma volume, which, in turn, determine major parameters of the plasma.

Plasma sources with parallel electrodes (so called "diode systems"), with parallel electrodes and a grid between the electrodes (so called "triode systems"), and magnetron-type plasma sources have found the widest application in the industry. In these sources, plasma may be generated by direct current (DC) power or by a high--frequency (RF frequency or higher, up to microwave [MW]) power source.

A typical diode plasma source is described by J. Reece Roth in: Industrial Plasma Engineering, Vol. 1, Principles, Institute of Physics Publishing, Bristol and Philadelphia, 1995, pp. 332, 438. Such a source consists of a vacuum chamber containing two parallel-plate electrodes. One electrode is grounded, and the other is connected to a negative terminal of a power supply source, e.g., an RF power supply. An object to be treated, e.g., a semiconductor wafer, is attached to the powered electrode. A working gas is supplied to the vacuum chamber, an RF power supply is activated and generates a plasma between the electrodes. This plasma has a certain spatial distribution with respect to the electrodes and the wafer. In such configuration, the surface of the wafer can be treated by energetic ions extracted from the plasma by the powered electrode and accelerated in the space between the plasma boundary and the surface of the wafer.

When energetic ions are not required, e.g., for etching by free radicals, by atoms in excited state, or by other plasma-related species, the wafer can be attached to the grounded electrode, while the other electrode is connected to a power source, e.g., an RF power supply.

in a triode-type plasma source, the grid is used for improving control of the ion energy on the surface of the object being treated. This is achieved by applying a control voltage to the grid.

However, the parallel-plate plasma source has a common disadvantage consisting in a low efficiency of ionization which does not allow to reach the ion density higher than $10^{10}$ cm$^{-3}$. Another drawback of such plasma sources is inability to control plasma space distribution and flow of charged particles.

Further development of plasma technique led to the design of low-pressure high plasma density sources, such electron cyclotron resonance plasma sources (hereinafter referred to as ECR plasma sources) and helicon plasma sources, which are described below.

A typical ECR plasma source is described, e.g., by Donal L. Smith in: Thin-Film Deposition. Principles and Practice, McGraw-Hills, Inc., NY-Toronto, 1995, p. 511.

It comprises a discharge chamber made of a nonmagnetic material with a quartz window for the supply of MW power for generation of plasma and a pair of solenoids which embrace the discharge chamber and are intended for generating a magnetic field in the gas-discharge chamber which creates conditions required for generating electron cyclotron resonance on a frequency of electromagnetic radiation of the microwave source (2.45 GHz). A working medium is supplied to the discharge chamber via a working gas supply tube for the supply of a working gas to the discharge chamber.

The aforementioned plasma source operates as follows:

The discharge chamber is evacuated to a high degree of vacuum of about $10^{-3}$ to $10^{-5}$ Torr required for effective absorption of microwave energy by the electrons of the plasma under conditions of the cyclotron resonance, and a working gas is supplied to the discharge chamber. A magnetic field with the intensity of about 87.5 mT is induced in the discharge chamber by the solenoid. A MW power with the frequency of 2.45 GHz is introduced into the discharge chamber via the quartz window. This generates a gas-discharge plasma. Since the coefficient of plasma diffusion in the transverse direction of the magnetic field several ten times smaller than the coefficient of plasma diffusion along the lines of forces of the magnetic field, the obtained plasma diffuses along the lines of forces of the magnetic field towards an object to be treated, e.g., a semiconductor substrate. Configuration of the plasma can be controlled by means of an additional solenoid located in the vicinity of the substrate.

A disadvantage of the aforementioned ECR plasma source consists in that it is difficult to control distribution of the plasma concentration from the source axis to the source periphery. This is because the conditions of the optimum discharge and the specific distribution of lines of forces of the magnetic field are interrelated. More specifically, the plasma is formed mainly in the area of equality between the frequency of rotation of electrons in the magnetic field and the frequency of the MW power source [see aforementioned reference to Smith, p. 511, 512]). Therefore, displacement of the plasma formation zone under the effect of the solenoid located in the vicinity of the substrate will affect the distribution of line of forces of the magnetic field and, hence, density of the plasma near the substrate surface and thus uniformity of treatment.

Other drawbacks of the aforementioned ECR plasma sources are dependence of the plasma formation zones on the zone of plasma diffusion in the direction of lines of forces of the magnetic field, a complicated construction of an ECR source which requires the use of an MV generator, necessity of matching of this generator with impedance of the gas-discharge plasma, a complicated construction of the gas-discharge chamber, etc.

Another disadvantage of the ECR plasma sources is that they are not suitable for uniformly treating objects of a very large surface area. This is because with an increase in the size of an object being treated, it is necessary to increase the diameter of a gas-discharge chamber, whereby uniformity of plasma across the cross-section of the gas-discharge plasma will be reduced.

Known in the art also are inductance plasma coupling (ICP) sources described, e.g., in the aforementioned book of J. Reece Roth, p. 413. They differ from the ECR plasma sources by the fact that plasma is excited by an electromagnetic field, e.g., of a flat spiral coil placed onto one of the electrodes. The power supply may be obtained, e.g., from a 13.56 MHz power source. These sources operate under pressures of $10^{-3}$ to $2 \cdot 10^{-2}$ Torr. and, similar to the ECR source, here the plasma density may reach $10^{12}$ cm$^{-3}$. ICP sources suffer from the same disadvantages as all other known plasma sources, i.e., difficulty to control the plasma density distribution, etc. Furthermore, ICP of large diameters require the use of high currents for plasma excitation coils which consume high power. This, in turn, makes the construction of the plasma source complicated and expensive, e.g., due to the use of a developed cooling system.

Another known source of the gas-discharge plasma is a so-called Penning discharge source [see aforementioned reference to Roth, p. 204.] The Penning discharge is a discharge that occurs in a longitudinal magnetic field between a cathode and an anticathode (i.e., an electrode through which plasma flows into a vacuum chamber, i.e., toward the substrate, and which has a cathode potential). As shown in FIG. 1, which is a schematic sectional view of a known Penning discharge source 20, the source has a tubular anode 22 located inside a gas-discharge chamber 24 between a cathode 26 and an anti-cathode 28. Anti-cathode 28 has a number of openings for extraction of ions from a plasma P generated inside cylindrical anode 22.

An object to be treated, e.g., a semiconductor substrate OB, is placed in a vacuum chamber 30 which is sealingly connected to plasma source 20. Anode 22 is connected to a positive terminal 32a of a DC power source 32. A negative terminal 32b of power source 32 is grounded at G1. Cathode 26 is grounded at G2 via a conductor 34 that passes through the wall of gas-discharge chamber 24 via an electric feedthrough 36. Anti-cathode 28 is grounded at G3 via a conductor 38 that passes through the wall of vacuum chamber 30 via an electric feedthrough 40.

In the Penning discharge, electrons perform oscillating movement between cathode 26 and anti-cathode 28, traveling along helical trajectories along lines of forces of the magnetic field.

The working gas is ionized under pressures within the range of $10^{-1}$ Torr to $10^{-7}$ Torr at a magnetic induction of 100 to $3 \cdot 10^4$ Ga. Discharge voltage can vary between 100 and 50,000 V, and the current can vary from $10^{-7}$ to 20 A. Temperature of electrons is within the range of 2 to 15 eV, while ion energy may vary from 1 eV to several keV.

The wide range of possible changes in the parameters of the discharge makes Penning discharge sources suitable for efficient industrial application in various fields. Nevertheless, they are unsuitable for uniform treatment of objects of a large surface area, since they cannot provide uniform distribution of plasma concentration in a radial (transverse) direction of plasma, especially in the case of a large cross-section of the plasma required for treating substrates having diameters up to 300 mm. Another disadvantage of such sources is dependence of a plasma flow distribution on the ionization of the working gas. In spite of all the advantages of the Penning discharge sources, the last-mentioned drawback significantly limits the scope of their practical industrial application, especially in view of latest rapid development of the electronic industry.

OBJECTS OF THE INVENTION

It is an object of the invention to provide a multiple-cell plasma source for plasma treatment of objects which is characterized by a simplicity of construction, uniformity of distribution of plasma, possibility of controlling distribution of the plasma concentration from the source axis to the source periphery, independence of the plasma formation zones on the zone of plasma diffusion in the direction of lines of forces of the magnetic field, possibility of uniformly treating objects of a large surface area due to uniform distribution of plasma concentration in a transverse direction of plasma, independence of a plasma flow distribution from the ionization of the working gas, and possibility of individually controlling plasma flows emitted from individual cells of the plasma source.

SUMMARY OF THE INVENTION

A multiple-cell plasma source consists of a pair of perforated plate-like cathodes and a perforated plate-like anode between the both cathode plates. Perforations in all three plates are coaxial and form a plurality of cells in which a Penning discharge plasma is generated due to the passage of axial components of the magnetic field through the individual cells. Since in all cells the plasma flow components are generated and work independently, there are no limitations for an increase in the surface area of the upper cathode plate, which has plasma emitting holes, so that the plasma source can treat objects of a large surface area. The plasma source of the invention has various means for controlling and adjusting the plasma pattern, distribution, parameters, and shape.

DETAILED DESCRIPTION OF THE INVENTION

Figure 2:
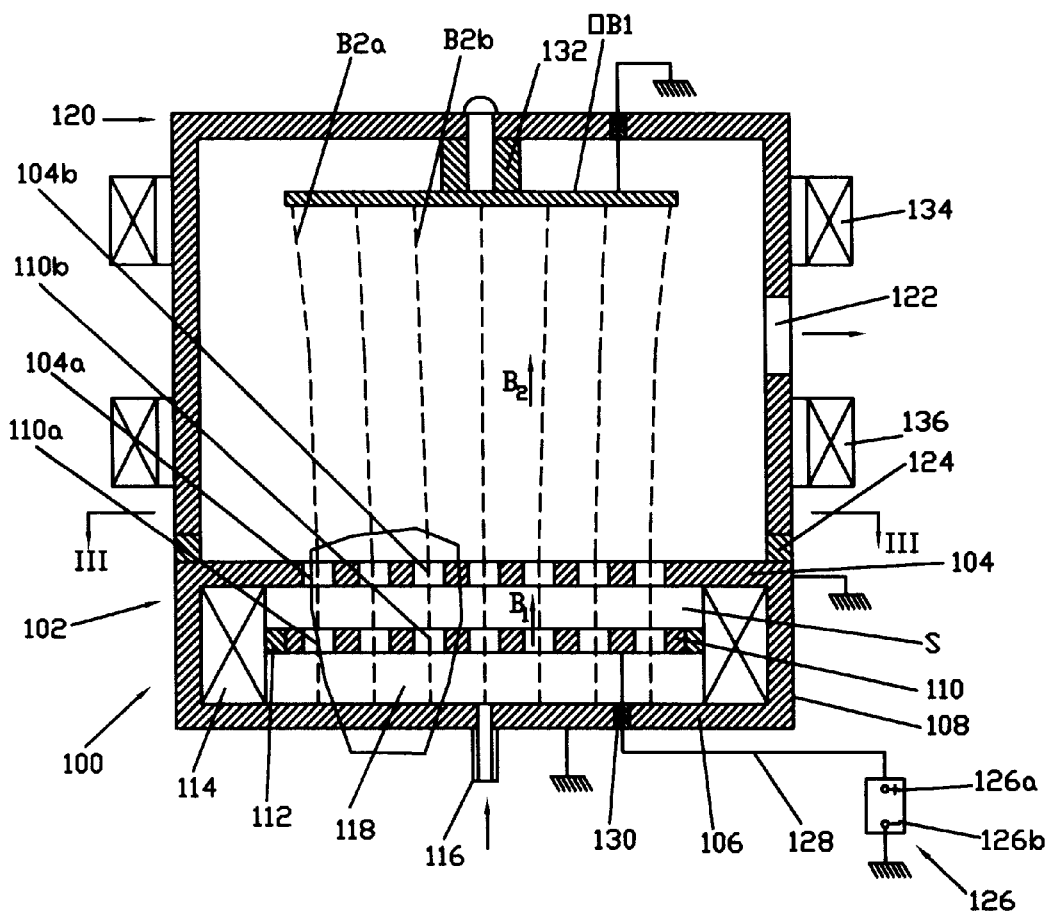
FIG. 2 is a schematic side view of a multiple-cell type plasma source made in accordance with one embodiment of the present invention.
Figure 3:
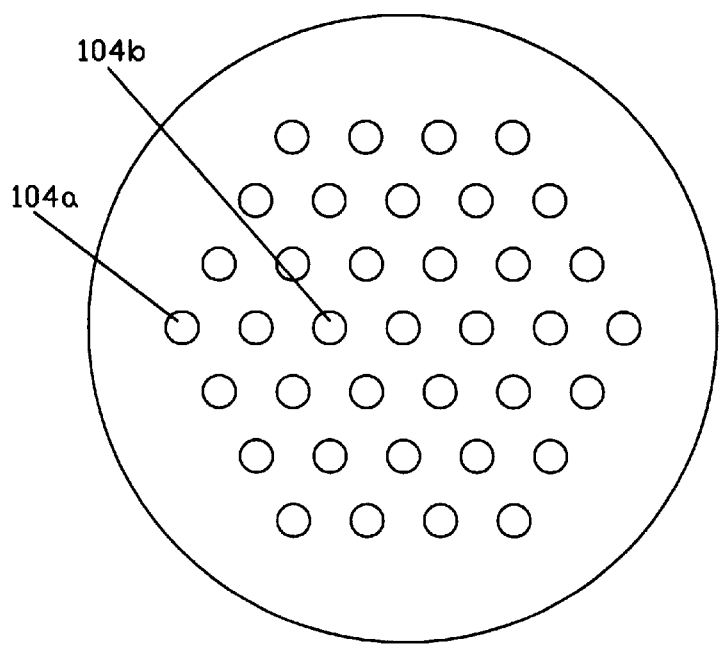
FIG. 3 is a cross-sectional view along line III—III of FIG. 2 showing uniform distribution of cells in the plasma source.

A low-temperature plasma source of the present invention is shown in FIG. 2, where FIG. 2 is a schematic side view of a multiple-cell type plasma source made in accordance with one embodiment of the present invention. FIG. 3 is a cross-sectional view along line III—III of FIG. 2.

As shown in FIG. 2, a plasma source 100 has a closed box-like housing 102 made of a magnetoconductive material, such as an Armco steel. Housing 102 has an upper plate 104, which functions as a first cathode, a lower plate 106, which functions as a second cathode, and side wall 108 which electrically connects plate 104 and plate 106. Although in the embodiment of FIGS. 2 and 3 housing 102 has a round cross section, it is understood that it may have an elliptical, oval, or a rectangular cross section.

Figure 3A:
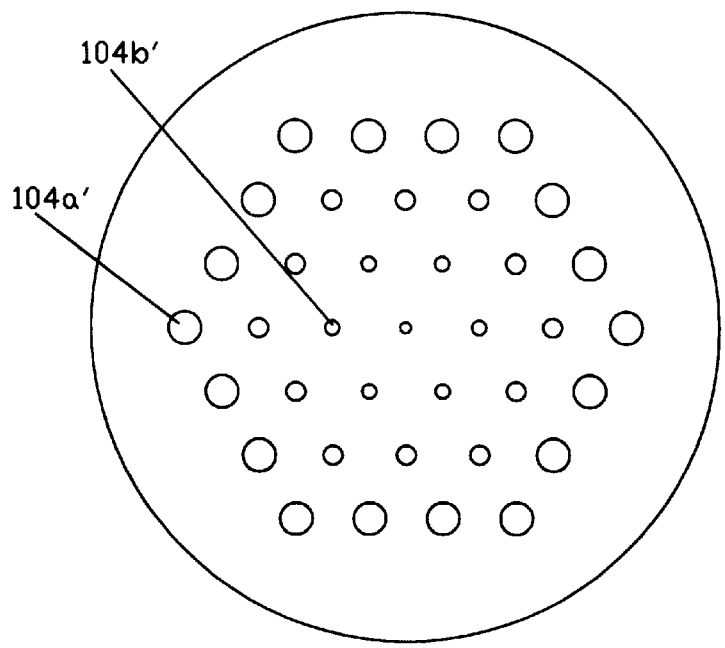
FIG. 3a is a cross-sectional view similar to FIG. 3 showing an example of a non-uniform distribution of cells of different diameters in the plasma source.

As shown in FIG. 3, upper cathode plate 104 has a round shape with uniformly distributed perforations 104a, 104b, ... of equal diameters. However, as shown in FIG. 3a, perforations 104a', 104b' ... may have different diameters or may have an arbitrary distribution pattern. This feature makes it possible to control distribution of plasma emitted through perforations of upper cathode plate towards the object to be treated. In other words, by changing the pattern and diameters of perforations in upper cathode plate 204, it becomes possible to provide different densities of plasma over the surface of the object being treated.

A platelike anode 110 is placed inside housing 102. Plate-like anode 110 is spaced from both cathode plates 104 and 106 and is electrically isolated from them by an insulating ring 112. A magnetic-field generating means, which in the illustrated embodiment is made in the form of a magnetic coil 114, is placed between the inner surface of side wall 108 and insulating ring 112. Magnetic coil 114 surrounds plate anode 110 and is intended for generating a magnetic field $B_1$ (FIG. 2), the function of which will be described later.

Plate anode 110 is perforated and has a plurality of uniformly distributed through holes 110a, 110b, ... (FIG. 2). First cathode plate 104 also has perforations 104a, 104b ... (FIGS. 2 and 3), which are coaxial to holes 110a, 110b, ...

A working gas supply tube 116 for the supply of a working gas to an anode-cathode space 118 is connected to lower cathode plate 106.

A sealed vacuum chamber 120, which has an evacuation port 122 connected to a vacuum pump (not shown), is connected to upper cathode plate 104 via a sealing ring 124.

Plate anode 110 is connected to a positive terminal 126a of a direct current source 126 by a conductor 128 that passes into housing 102 via a feedthrough mechanism 130.

An object, e.g., a semiconductor substrate OB1, is supported in vacuum chamber 120 by a supporting block 132 opposite upper cathode plate 104.

If necessary, solenoids 134 and 136 can be installed around vacuum chamber 120 for controlling a magnetic field of plasma formed inside vacuum chamber 120.

Figure 1:
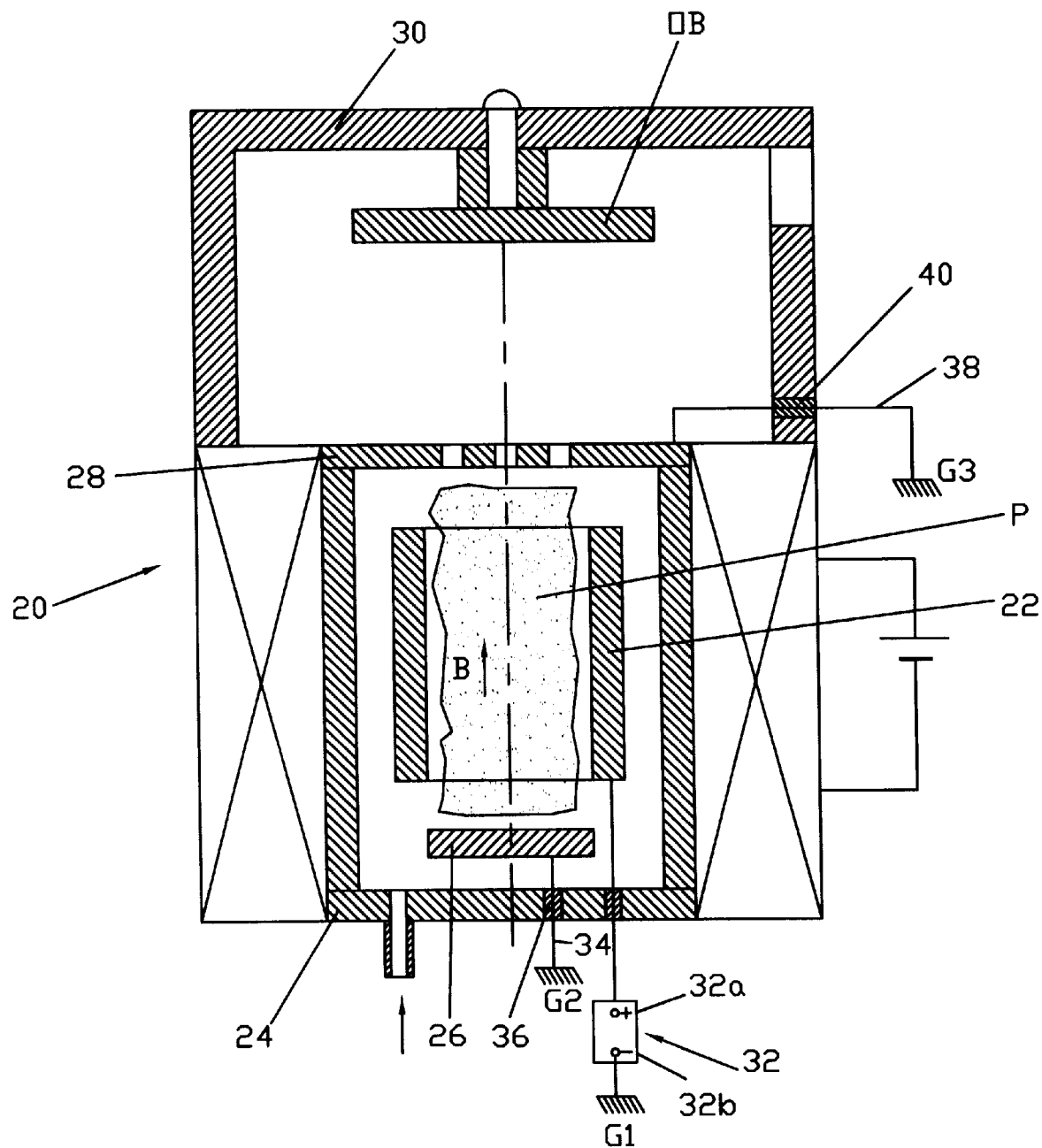
FIG. 1 is a schematic sectional view of a known Penning discharge plasma source.
Figure 2A:
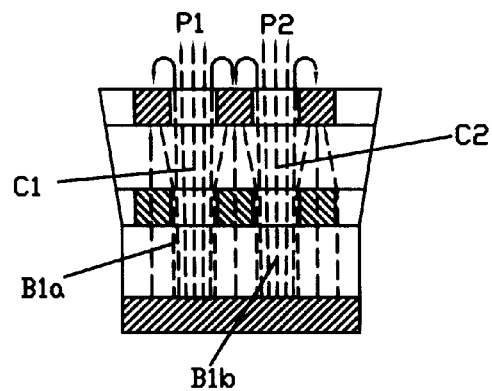
FIG. 2a is a fragmental sectional view of plasma source of FIG. 2.

Plasma source 100 operates as follows:

Vacuum chamber 120 is evacuated, and a working gas is fed into the interior of housing 102 of the ion source via a working gas supply tube 116. A magnetic field $B_1$ shown in FIG. 2 by broken lines is generated by magnetic coil 114 inside housing 102 of plasma source 100. Lines of forces of the magnetic field will pass from solenoid coil 114, via lower magnetoconductive plate, i.e., lower cathode plate 106, perforations 110a, 110b, ..., an anode-cathode space S, perforations 104a, 104b, ... of upper cathode plate 104, upper cathode plate 104, side wall 108 of housing 102, and back to lower cathode plate 106. Since upper cathode plate 104 has perforations 104a, 104b, ..., magnetic field $B_1$ is split into portions and form axial components of the magnetic field which appear in each cell C1, C2, ... of plasma source 100 formed between cathode plates 104 and 106 by openings 110a, 110b ... in plate anode 110 and perforations 104a, 104b, ... in upper cathode plate 104. The aforementioned cells and axial components $B_{1a}$, $B_{ib}$, ... of magnetic field $B_1$ in each individual cell are shown in FIG. 2a, which is a fragmental sectional view of plasma source 100 of FIG. 1. These individual axial components $B_{1a}$, $B_{ib}$, ... of magnetic field $B_1$ may reach significant values up to 10 mT or more, which are required for the efficient formation of the Penning discharge in each cell.

More specifically, a magnetic field required for maintaining the Penning discharge is a scattered magnetic field generated inside each cell C1, C2, ... In the embodiment of FIGS. 2, 2a, and 3, the Penning discharge magnetic field has orientation essentially perpendicular to the planes of the lower cathode plate 106, upper cathode plate 104, and plate anode 110.

Penning discharge can produce a dense plasma at pressures far below those at which other glow discharges operate, i.e., at the pressures at which ion-beam source of the type described in the present invention operates, e.g., $10^{-2}$ to $10^{-5}$ Torr. The aforementioned dense plasma is generated as a result of trapping of the ionized electron population in an axial electrostatic potential well. In the Penning discharge the electrons have very long ionization mean free path, greater than the discharge length, at the low pressures at which these discharges are operated. In the context of the present invention, the discharge length means the distance between the upper and lower cathode plates. Drifting electrons held by the Penning discharge move along helical trajectories so that the life of such electrons is extended. In fact, the electrons in each cell will reciprocate along the aforementioned helical trajectories between upper cathode plate 104 and lower cathode plate 106 via the openings of the .respective cells. When the electrons collide with molecules of working gas, they form positive ions or plasma which has a potential close to that of the anode.

When the working gas is passed through cells C1, C2 ... of the magnetic field, component plasma flows P1, P2 ... will propagate via openings 104a, 104b, ... of upper cathode plate (FIGS. 2a) along lines of force toward object OB1 and treat the object surface.

General configuration of plasma formed by plasma flows P1, P2, ... can be controlled by auxiliary solenoid coils 134 and 136 which generate magnetic field $B_2$, so that plasma flows P1, P2, ... will move along lines of force of magnetic field $B_2$. An example of one such pattern is shown in FIG. 2 by broken lines $B_{2a}$, $B_{2b}$, ...

Plasma generated by plasma source 100 is not scattered as in a conventional plasma source but is distributed through individual cells C1, C2, ... essentially across the entire surface of upper cathode plate 104 (FIG. 3).

Figure 4:
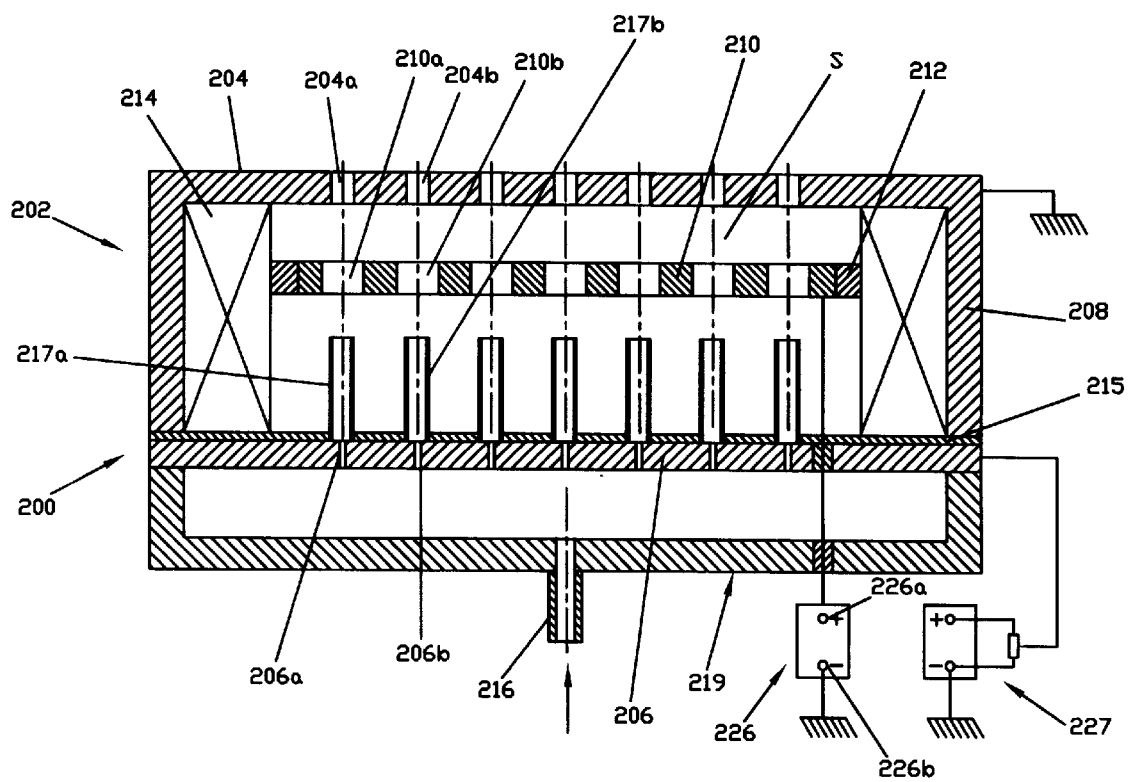
FIG. 4 illustrates a plasma source of the invention with tubular extensions from a lower cathode plate towards an anode.

FIG. 4 illustrates a plasma source 200 made in accordance with another embodiment of the invention, which, in general, is similar to the embodiment of FIGS. 2, 2a and 3. Therefore parts and units of the embodiment of FIG. 4 similar to those of the embodiment of FIGS. 2, 2a, and 3 will be designated by the same reference numerals with an addition of 100. In FIG. 4, a vacuum chamber and an object are not shown.

Plasma source 200 (FIG. 4) has a closed box-like housing 202 made of a magnetoconductive material, such as an Armco steel. Housing 202 has an upper plate 204, which functions as a first cathode, a lower plate 206, which functions as a second cathode, and side wall 208 which electrically connects plate 204 and plate 206. Housing 202 may have a round, elliptical, oval, rectangular, or any other suitable cross section.

A plate-like anode 210 is placed inside housing 206. Plate-like anode 210 is spaced from both cathode plates 204 and 206 and is electrically isolated from them by an insulating ring 212. A magnetic-field generating means, which in the illustrated embodiment is made in the form of a magnetic coil 214, is placed between the inner surface of side wall 208 and insulating ring 212. Magnetic coil 214 surrounds plate anode 210 and is intended for generating a magnetic field (not shown), the function of which is the same as the function of magnetic field $B_1$ described with reference to the previous embodiment of the invention.

Plate anode 210 is perforated and has a plurality of uniformly distributed through holes 210a, 210b, . . . First cathode plate 204 also has perforations 204a, 204b. . . which are coaxial to holes 210a, 210b, . . .

An insulating ring 215 is placed between magnetic coil 214 and lower cathode plate 206 which has a plurality of small-diameter perforations 206a, 206b, . . . for the passage of a working medium. Lower cathode plate 206 supports a plurality of tubular extensions 217a, 217b, . . . made of a conductive material such as Fe, Ta, Ti, W, C, etc. Each tubular extension is in a conductive contact with lower cathode plate for application of an electric potential to these tubular extensions, which extend towards plate anode 210 and are coaxial to respective perforations 206a, 206b, . . . as well to respective holes 210a, 210b, . . . in plate anode 210. However, extensions 217a, 217b, . . . do not reach plate anode 210 and are spaced from it at a certain distance.

A working gas collector chamber 219 is sealingly connected to lower cathode plate 206 for the supply of a working gas via a gas supply tube 216 and via respective perforations 206a, 206b, . . . and through extensions 217a, 217b, . . . to an anode-cathode space S between plate anode 210 and upper cathode plate 204.

Plate anode 210 is connected to a positive terminal 226a of a first direct current power source 226. A negative terminal 226b of power source 226 is grounded.

A lower cathode plate 206 is connected to a second direct current source 227 which applies to lower cathode plate 206 a voltage adjustable with regard to the ground.

Plasma source 200 of FIG. 4 operates in the same manner as plasma source 100 of the previous embodiment with separation of the magnetic field into separated axial components passing through individual cells formed by perforations 206a, 206b, . . . , tubular extensions 217a, 217b. . . , holes 210a, 210b, . . . in plate anode 210, and perforations 204a, 204b, . . . in upper cathode plate 204. However, provision of tubular extensions 217a, 217b, . . . facilitates ignition of discharge, ensures its localization, and reduces discharge voltage. This is because working gas pressure is localized and increased within tubular extensions 217a, 217b, . . . An increase of the pressure within tubular extensions 217a, 217b, . . . increases probability of collisional ionization of molecules of the working gas by electrons. It should be noted, that tubular extensions operate effectively at predetermined length/diameter ratios, which in general should exceed 5, preferably 10.

Figure 4A:
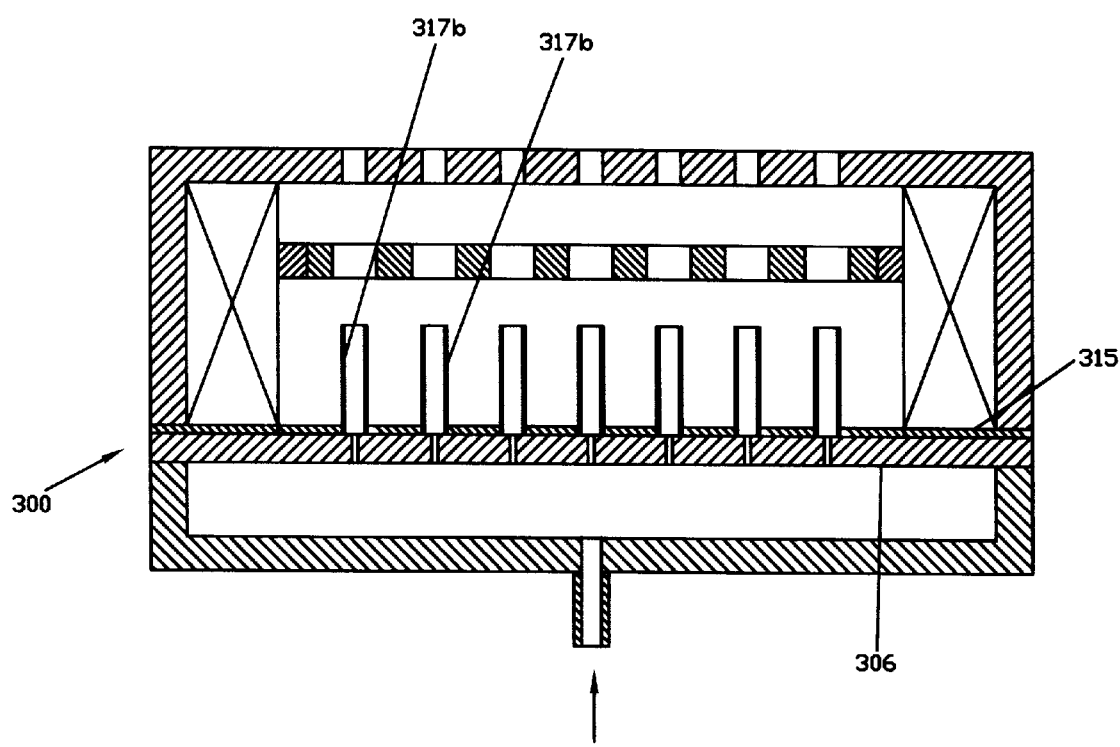
FIG. 4a is a fragmental view of a plasma source of FIG. 4 in which an insulation plate covers the entire surface of a lower cathode plate, except for openings.

FIG. 4a is a fragmental view of a plasma source 300 of another embodiment of the invention, which is similar to the one shown in FIG. 4 and differs from it only in that an insulation plate 315 covers the entire surface of a lower cathode plate 206, except for areas occupied by the ends of tubular extensions 317a, 317b, . . . Such a construction reduces contamination of plasma with the material of lower cathode plate 306.

Figure 5A:
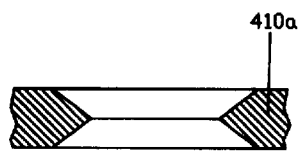
FIGS. 5a, 5b, and 5c illustrate elements of magnetic optics utilized in the plasma sources of the present invention for efficiently controlling a direction of the magnetic field and hence of the plasma flow.
Figure 5B:
Figure 5C:
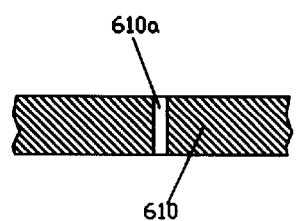

FIGS. 5a, 5b, and 5c illustrate elements of magnetic optics utilized in the plasma sources of the present invention for efficiently controlling a direction of the magnetic field and hence of the plasma flow.

More specifically, FIG. 5a illustrates the shape of openings in plate anodes 110, 210, and 310. The side walls of the openings have inwardly directed tapered ribs 410a. Such configuration improves efficiency of ionization of the working gas since the surface area of contact of plasma with the anode is reduced.

FIG. 5b illustrates openings in the upper cathode plate with side walls 510a of the openings diverging in the direction of the emission of the plasma. Such configuration increases the yield of plasma through the upper cathode plate.

FIG. 5c shown an embodiment of the plasma source of the type shown in FIG. 5 with perforations 610a in a lower cathode plate 610 without tubular extensions. Such configuration localizes discharge closer to lower cathode plate 610. The smaller are the diameters of perforations 610a, the higher is the degree of discharge localization.

Figure 6:
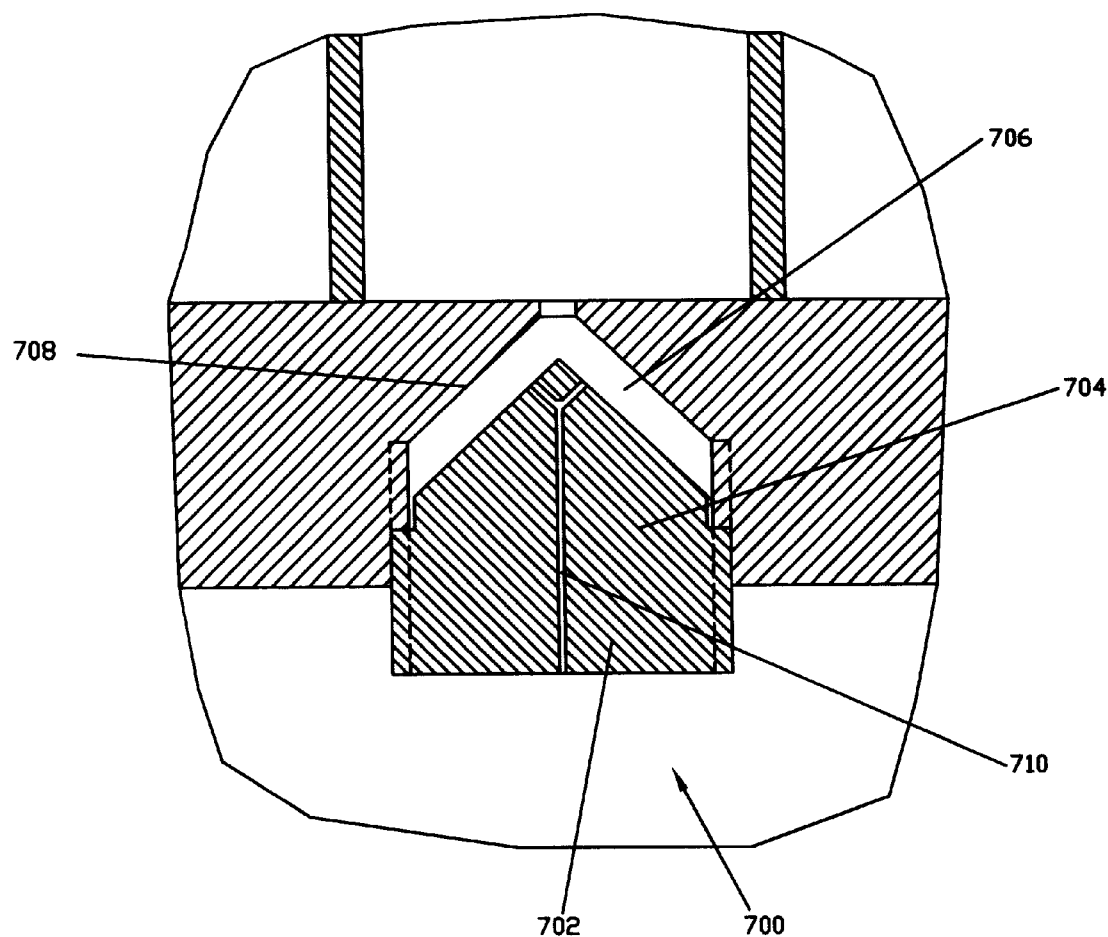
FIG. 6 is a sectional view of an adjustable jet nozzle for controlling gasodynamic resistance to a working gas admitted into each cell of the plasma source.

Perforations 610a can be provided with adjustable jet nozzles 700 of the type shown in FIG. 6. As shown in this drawing, jet nozzle 700 may comprise a threaded valve element 702 with a tapered tip 704 threaded into an opening 706 with a tapered end 708. Valve element 702 has a through axial channel 700 open into opening 706. By threading valve element into or out of opening 706, it is possible to adjust gasodynamic resistance of the working gas supplied to the housing of the plasma source, e.g., via a tubular extension 712, or without extension directly to the housing. Such jet nozzles 700 can be used for individually adjusting operation of each cell of the plasma source.

Figure 7:
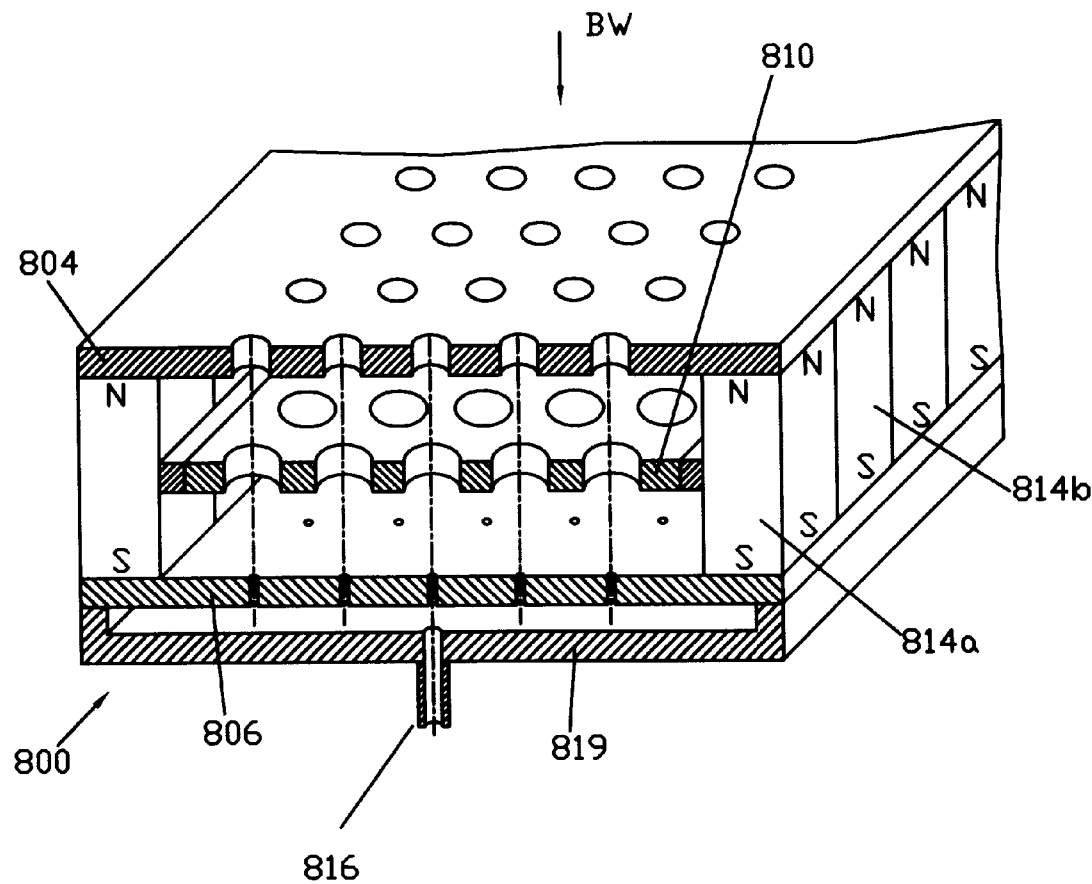
FIG. 7 is a partial sectional three-dimensional view of a plasma source having a rectangular shape.
Figure 9:
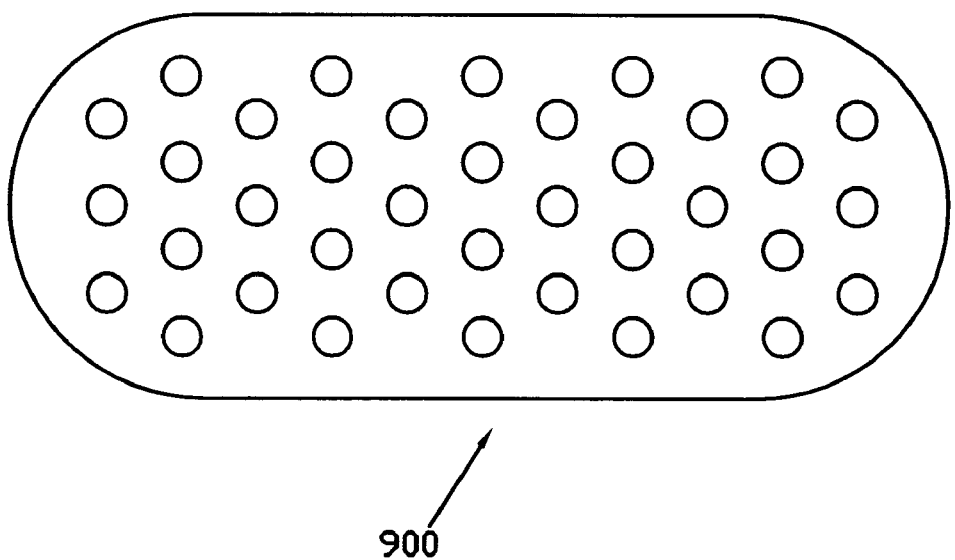
FIG. 9 is a top view of an oval-shaped plasma source.
Figure 8:
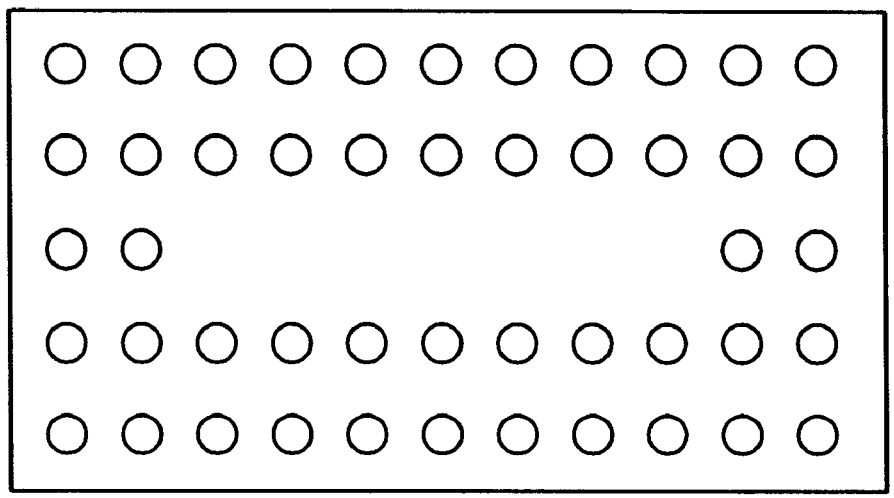
FIG. 8 is a top view of the plasma source of FIG. 7 with nonuniform distribution of cells.

FIG. 7 is a sectional three-dimensional view of a plasma source 800 which is similar to plasma source 200 of FIG. 4 and differs from it in that this plasma source does not have longitudinal extensions and in that an upper cathode plate 804, a lower cathode plate 806, and a plate anode 810 have a rectangular shape of the type shown in FIG. 8. FIG. 8 is a top view on plasma source 800 in the direction of arrow BW of FIG. 7. The remaining elements of plasma source, i.e., a working gas collector chamber 819, gas supply tube 816, etc., are the same as in the aforementioned previous embodiment. However, for a rectangular plasma source of the type shown in FIGS. 7, 8 (as well as for an oval-shaped plasma source 900, the top view of which is shown in FIG. 9), it is more convenient to use a plurality of rectangular permanent magnets 814a, 814b, . . . (FIG. 7) that can be installed side by side along linear sides of the source.

Figure 10:
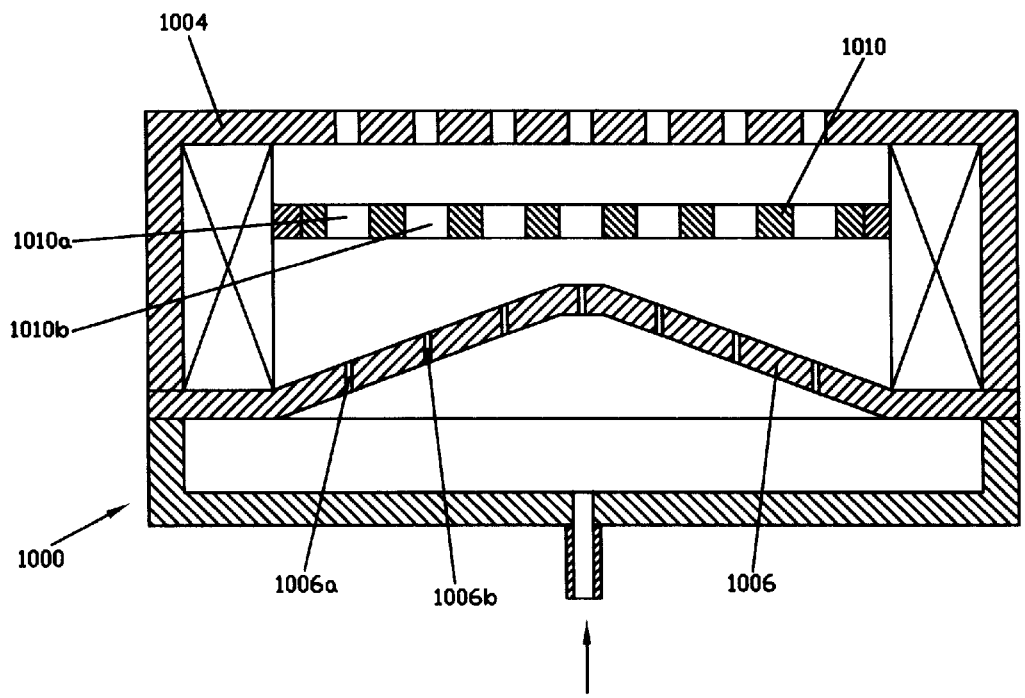
FIG. 10 is a side sectional view of a plasma source in which a lower cathode plate has a profile convex toward a plate anode.

FIG. 10 illustrates a plasma source 1000 which is similar to the one shown in FIG. 7 and differs from it in that a lower cathode plate 1006 has a profile convex toward a plate anode 1010. Different distances between perforations 1006a, 1006b . . . and respective holes 1010a, 1010b, . . . of plate anode 1010 change magnetic field and discharge voltages of the Penning discharge in adjacent cells, whereby parameters of the plasma at the outlets from various cells of plasma source 1000 are also changed. In other words, in the embodiment of FIG. 10, the magnetic field is weaker in the marginal cells than in the center of the source.

Figure 11:
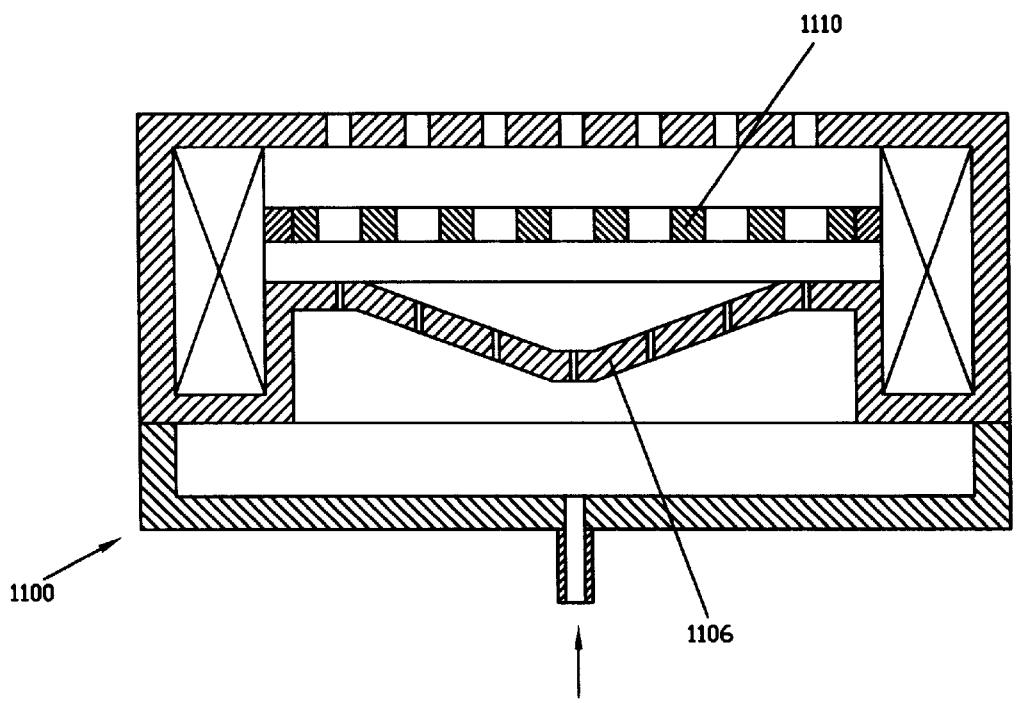
FIG. 11 is a side sectional view of a plasma source in which a lower cathode plate has a profile concave toward a plate anode.

An opposite phenomenon takes place in a plasma source 1100 of the type shown in FIG. 11, which is similar to the one shown in FIG. 10 and differs from it in that lower cathode plate 1106 has a profile concave with respect to plate anode 1110. In other words, in the embodiment of FIG. 11, the magnetic field is stronger in the marginal cells than in the center of the source.

Figure 12:
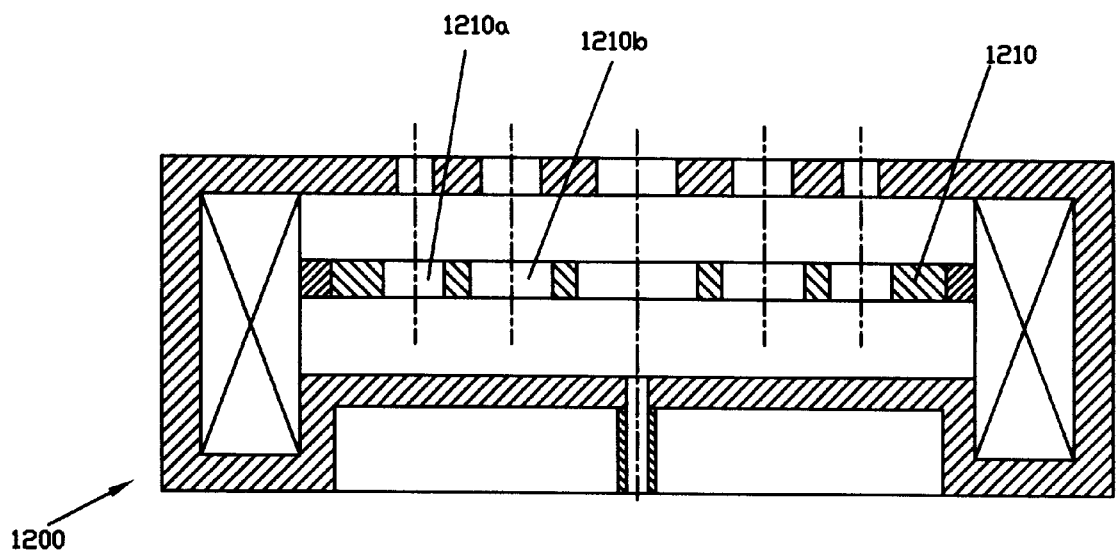
FIG. 12 is a side sectional view of a plasma source in which openings in the plate anode have different diameters.

FIG. 12 shows an embodiment of a plasma source 1200, which differs from the previous embodiments in that electric fields in the Penning discharge of adjacent cells vary due to different diameters of holes 1210a, 1210b, . . . in plate anode 1210. The greater the hole diameter, the weaker the electric field in the transverse direction of the hole.

Thus, since in all cells of the plasma sources of all embodiments of the invention plasma flow components are generated and work independently, there are no limitations for an increase in the surface area of the upper cathode plate which has plasma emitting holes. This means that the multiple cell source of the invention can be produced with dimensions suitable for treating objects of large surface area. In addition, the plasma pattern, distribution, parameters, and shape can be adjusted and controlled in various ways.

In other words, it has been shown that the invention provides a multiple-cell plasma source for plasma treatment of objects which is characterized by a simplicity of construction, uniformity of distribution of plasma, possibility of controlling distribution of the plasma concentration from the source axis to the source periphery, independence of the plasma formation zones on the zone of plasma diffusion in the direction of lines of forces of the magnetic field, possibility of uniformly treating objects of a large surface area due to uniform distribution of plasma concentration in a transverse direction of plasma, independence of a plasma flow distribution from the ionization of the working gas, and possibility of individually controlling plasma flows emitted from individual cells of the plasma source.

Although the invention has been shown and described with reference to specific embodiments, it is understood that these embodiments were given only as examples and that any changes and modifications are possible, provided they do not depart from the scope of the appended claims. For example, different diameters of holes in plate anode can be used in all other embodiments, i.e., in plasma sources of FIGS. 2, 4, 7, 8, 9, 10 and 11. The same relates to the use of nozzles of FIG. 6 which can be installed in perforations of the lower cathode plate of a plasma source of the invention of any type. In other words, tubular extensions, rectangular shapes, plasma controlling solenoids, permanent magnets, shapes of holes, perforation distribution patterns, and other specific features of various embodiments of the invention can be incorporated in various embodiments in various combinations, provided they do not depart from the scope f the patent claims. The same relates to materials and configurations of parts. The second power source 227 shown in FIG. 4 can be an AC power source. Working gas can be supplied to the housing of the source through a side wall.

What is claimed is:

1. A multiple-cell plasma source for plasma treatment of surfaces of objects, comprising:

hollow housing means formed at least by a second cathode means, first cathode means with a plurality of through openings, said first cathode means being spaced from said second cathode means forming a space therebetween;

anode means located in said space between said first cathode means and said second cathode means, said anode means being electrically isolated from said hollow housing and having openings which are coaxial to said openings of said first cathode means;

said second cathode means, said openings of said first cathode means, and said openings of said anode means forming individual plasma generating cells of said plasma source;

magnetic field generating means for generating a magnetic field which is split into portions generating axial components of lines of forces of the magnetic field which pass through said cells;

working gas supply means for the supply of a working gas into said hollow housing means;

first electrical means for applying to said anode means a potential positive with respect to said first cathode means and to said second cathode means; and a vacuum chamber which contains said object located opposite said openings of said first cathode means.

2. The plasma source of claim 1, further comprising:

means for isolating said first cathode means from said second cathode means;

openings in said second cathode means are coaxial to said openings in said first cathode means and in said anode means; and tubular extensions made of a conductive material and extending from said openings of said second cathode means toward said openings of said anode means.

3. The plasma source of claim 2, further comprising second electric means for applying an adjustable voltage to said first cathode means.

4. The plasma source of claim 2, wherein said working gas supply means comprises a hollow collector chamber which is sealingly attached to said second cathode means, is open to said openings of said second cathode means, and has a gas supply tube for the supply of working gas into said collector chamber.

5. The plasma source of claim 4, wherein said openings in said anode means have inwardly tapered edges for limiting the surface of contact of plasma with said anode means.

6. The plasma source of claim 4, wherein said openings of said first cathode are tapered so that they diverge toward said object.

7. The plasma source of claim 4, further comprising second magnetic field generating means for controlling said plasma in said vacuum chamber.

8. The plasma source of claim 4 wherein said anode means, said first cathode means, and said second cathode means are plates.

9. The plasma source of claim 4, wherein said openings of the second cathode contain means for adjusting gasodynamic resistance of the working gas passing through said means to said first openings.

10. The plasma source of claim 9, wherein said means for adjusting comprises a threaded nozzle screwed into each said openings of the second cathode for adjusting a cross-section of said first openings of the second cathode for passage of said working gas.

11. The plasma source of claim 4, wherein said hollow housing, said first cathode means, said second cathode means, and said anode means have on a top view a shape selected from a round, oval, or rectangular shape.

12. The plasma source of claim 2, wherein said second cathode means is convex toward said anode means so that distances from said openings of said second cathode means toward said openings of said anode means are decreased from a periphery of said hollow housing toward the center of said hollow housing.

13. The plasma source of claim 2, wherein said second cathode means is concave toward said anode means so that distances from said openings of said second cathode means toward said openings of said anode means are increased from a periphery of said hollow housing toward the center of said hollow housing.

14. The plasma source of claim 2, wherein said means for isolating comprises a ring of an insulating material.

15. The plasma source of claim 2, wherein said means for isolating comprises a plate of an insulating material which covers the entire surface of said second cathode means, except said openings in said second cathode means and said tubular extensions.

16. The plasma source of claim 2, wherein said openings of said second cathode means have adjusting means for adjusting gasodynamic resistance of the working gas passing through said adjusting means to said first openings.

17. The plasma source of claim 16, wherein said adjusting means comprises a threaded nozzle screwed into each of said openings of said second cathode means for adjusting a cross-section of said openings of said second cathode means for passage of said working gas.

18. The plasma source of claim 1, wherein said openings in said anode means have inwardly tapered edges for limiting the surface of contact of plasma with said anode means.

19. The plasma source of claim 1, wherein said openings of said first cathode means are tapered so that they diverge toward said object.

20. The plasma source of claim 1, further comprising second magnetic field generating means for controlling said plasma in said vacuum chamber.

21. The plasma source of claim 1, wherein said anode means, said first cathode means, and said second cathode means are plates.

22. The plasma source of claim 1, wherein said hollow housing, said first cathode means, said second cathode means, and said anode means have on a top view a shape selected from a round, oval, or rectangular shape.

23. The plasma source of claim 1, wherein said hollow housing, said first cathode means, said second cathode means, and said anode means have on a top view a round shape and said first means for generating said magnetic field is a solenoid coil which surrounds said anode means and is electrically isolated therefrom.

24. The plasma source of claim 1, wherein said hollow housing, said first cathode means, said second cathode means, and said anode means have on a top view a rectangular shape and said first means for generating said magnetic field is a plurality of permanent magnets arranged around said anode means between said first cathode means and said second cathode means.

25. The plasma source of claim 1, wherein said cells have an arbitrary distribution.

26. The plasma source of claim 25, wherein said openings in said first cathode means have different diameters.

27. The plasma source of claim 1, wherein said openings in said anode means have different diameters.

28. A method for treating the surface of an object by plasma, comprising:
providing a multiple-cell plasma source having first cathode means, second cathode means and anode means therebetween with a plurality of cells, each said cell being formed by coaxial through openings at least in said first cathode means and said anode means;
placing said multiple-cell plasma source into vacuum;
generating a magnetic field between said first cathode means and said second cathode means;
splitting said magnetic field into portions which pass through said cells in the form of axial components;
passing a gaseous working medium through said cells, generating an electric field between said anode means and said first and second cathode means, igniting a Penning discharge in each said cell, and generating plasma in said cells in said multiple-cell plasma source;
extracting plasma from cells towards said object via said openings in said first cathode means in the form of distributed flows of plasma; and
treating the surface of said object with said distributed flows of plasma.

29. The method of claim 28, further comprising a step of controlling the pattern of distribution and characteristics of said plasma flows on the surface of said object.

30. The method of claim 29, wherein said second cathode means has through openings coaxial with said openings in said first cathode means and in said anode means, said step of controlling being performed by changing diameters of at least one of said through openings selected from the openings in said first cathode means and said anode means.

31. The method of claim 29, wherein said step of controlling being performed by changing a distribution pattern of said cells.

32. The method of claim 29, wherein said step of controlling being performed by changing a gasodynamic resistance to the flow of said gaseous working medium through openings which are used for the supply of said gaseous working medium into multiple-cell plasma source.

33. The method of claim 29, wherein said step of controlling being performed by changing distances between said first cathode means and said second cathode means in adjacent cells.

* * * * *